(12) United States Patent
Lee et al.

(10) Patent No.: US 7,999,299 B2
(45) Date of Patent: Aug. 16, 2011

(54) SEMICONDUCTOR MEMORY DEVICE HAVING CAPACITOR FOR PERIPHERAL CIRCUIT

(75) Inventors: Jung-Hwa Lee, Gyeonggi-do (KR); Si-Woo Lee, Seoul (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 296 days.

(21) Appl. No.: 12/264,490

(22) Filed: Nov. 4, 2008

(65) Prior Publication Data

US 2009/0065837 A1 Mar. 12, 2009

Related U.S. Application Data

(63) Continuation-in-part of application No. 11/361,580, filed on Feb. 24, 2006, now Pat. No. 7,462,912.

(30) Foreign Application Priority Data

Jun. 23, 2005 (KR) ................... 2005-54365
Oct. 16, 2008 (KR) ............... 2008-0101617

(51) Int. Cl.
*H01L 27/108* (2006.01)
(52) U.S. Cl. ............... 257/303; 257/311; 257/E27.088
(58) Field of Classification Search .................. 257/303, 257/311, E27.088, 296
See application file for complete search history.

(56) References Cited

U.S. PATENT DOCUMENTS

| 4,442,447 | A | 4/1984 | Ipri et al. |
| 6,104,053 | A * | 8/2000 | Nagai ............... 257/303 |
| 6,218,260 | B1 * | 4/2001 | Lee et al. ............. 438/398 |
| 6,381,165 | B1 | 4/2002 | Lee et al. |
| 6,433,381 | B2 | 8/2002 | Mizutani et al. |
| 6,803,641 | B2 | 10/2004 | Papa Rao et al. |
| 7,166,882 | B2 | 1/2007 | Nakamura et al. |
| 7,271,476 | B2 | 9/2007 | Nishikawa et al. |
| 2005/0054159 | A1 | 3/2005 | Manning et al. |
| 2005/0093046 | A1 | 5/2005 | Ahn |
| 2006/0091470 | A1 | 5/2006 | Noguchi et al. |
| 2006/0113633 | A1 | 6/2006 | Park et al. |
| 2007/0296020 | A1 | 12/2007 | Shiba et al. |

FOREIGN PATENT DOCUMENTS

| KR | 1998-035297 | 8/1998 |
| KR | 2000-0045346 | 7/2000 |
| KR | 2000-0066946 | 11/2000 |
| KR | 2006-0101685 | 9/2006 |
| KR | 2006-0134579 | 12/2006 |

OTHER PUBLICATIONS

English language abstract of Korean Publication No. 1998-035297.
English language abstract of Korean Publication No. 2000-0045346.
English language abstract of Japanese Publication No. 2000-0066946.

(Continued)

*Primary Examiner* — Wael M Fahmy
*Assistant Examiner* — John C Ingham
(74) *Attorney, Agent, or Firm* — Muir Patent Consulting, PLLC

(57) ABSTRACT

Provided is a semiconductor memory device having peripheral circuit capacitors. In the semiconductor memory device, a first node is electrically connected to a plurality of lower electrodes of a plurality of capacitors in a peripheral circuit region to connect at least a portion of the capacitors in parallel. A second node is electrically connected to a plurality of upper electrodes of the capacitors in the peripheral circuit region to connect at least a portion of the capacitors in parallel. The first node is formed at substantially the same level as a bit line in a cell array region and is formed of the same material used to form the bit line.

20 Claims, 7 Drawing Sheets

OTHER PUBLICATIONS

English language abstract of Japanese Publication No. 2006-0101685.

English language abstract of Japanese Publication No. 2006-0134579.

* cited by examiner

SEMICONDUCTOR MEMORY DEVICE HAVING CAPACITOR FOR PERIPHERAL CIRCUIT

CROSS-REFERENCE TO RELATED APPLICATIONS

This application is a Continuation-In-Part of U.S. Ser. No. 11/361,580, filed on Feb. 24, 2006, which claims priority from Korean Patent Application No. 10-2005-54365, filed on Jun. 23, 2005, now pending. This application also claims the benefit of Korean Patent Application No. 10-2008-0101617, filed on Oct. 16, 2008, in the Korean Intellectual Property Office, the disclosure of which are hereby incorporated in their entirety by reference.

BACKGROUND

This inventive concept relates to a semiconductor memory device, and more particularly, to a semiconductor memory device having capacitors in a peripheral circuit region.

As the integration density of semiconductor memory devices, for example, a dynamic random access memory (DRAM) device, increases, the demand for increasing the operating speed of the semiconductor memory device as well as the demand for increasing the storage capacity of the semiconductor memory device have also increased. Accordingly, a capacitor having various functions is required in a peripheral circuit of the semiconductor memory device.

In general, when the integration density of a semiconductor memory device is increased, the number of operating circuits is increased in proportion to the increase in the integration density of the semiconductor memory device. As a result, severe fluctuation noise can instantly be caused to a power source voltage VDD and a ground voltage VSS when a reading operation or a writing operation starts. In order to address this problem, a semiconductor memory device conventionally includes a power decoupling capacitor for filtering noise present between operational power sources, such as the power source voltage VDD and the ground voltage VSS. An internal voltage boosting circuit is a pumping circuit for forming a power source, for example, a bulk bias VBB and a boost voltage VPP that are not inputted from the outside, and includes at least one pumping capacitor to store charges in one stage and to transmit the charges in a subsequent stage.

In this peripheral circuit (e.g., the power decoupling capacitor and the pumping capacitor), however, there is often a problem where the effective capacitance is substantially reduced under high frequency conditions due to a high resistance.

SUMMARY

Embodiments of this inventive concept provide a semiconductor memory device having a capacitor for a peripheral circuit that can be operated as a highly integrated circuit by increasing the effective capacitance through a reduction in resistance.

According to an exemplary embodiment, a semiconductor memory device may include a cell array region formed of a plurality of unit cells, where each unit cell includes a transistor, a bit line that is electrically connected to a first source/drain region of the transistor, a buried contact that is electrically connected to a second source/drain region of the transistor, and a cell capacitor that is electrically connected to the second source/drain region through the buried contact. The semiconductor memory device may also include a peripheral circuit region that includes first peripheral circuit capacitor that comprises a plurality of first capacitors that are formed at a similar level to the cell capacitor of the cell array region. The plurality of first capacitors may be connected to each other in parallel. The semiconductor memory device may also include a first node of the first peripheral circuit capacitor that is electrically connected to a plurality of lower electrodes, which constitute the first capacitors in the peripheral circuit region, in order to connect at least a portion of the first capacitors in parallel. The semiconductor memory device may also include a second node of the first peripheral circuit capacitor that is electrically connected to a plurality of upper electrodes, which constitute the first capacitors in the peripheral circuit region, in order to connect at least a portion of the first capacitors in parallel. The first node of the first peripheral circuit capacitor may include a first conductive layer formed in the peripheral circuit region at a similar level to the bit line of the cell array region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings in which exemplary embodiments of the inventive concept are shown.

Figure 1:
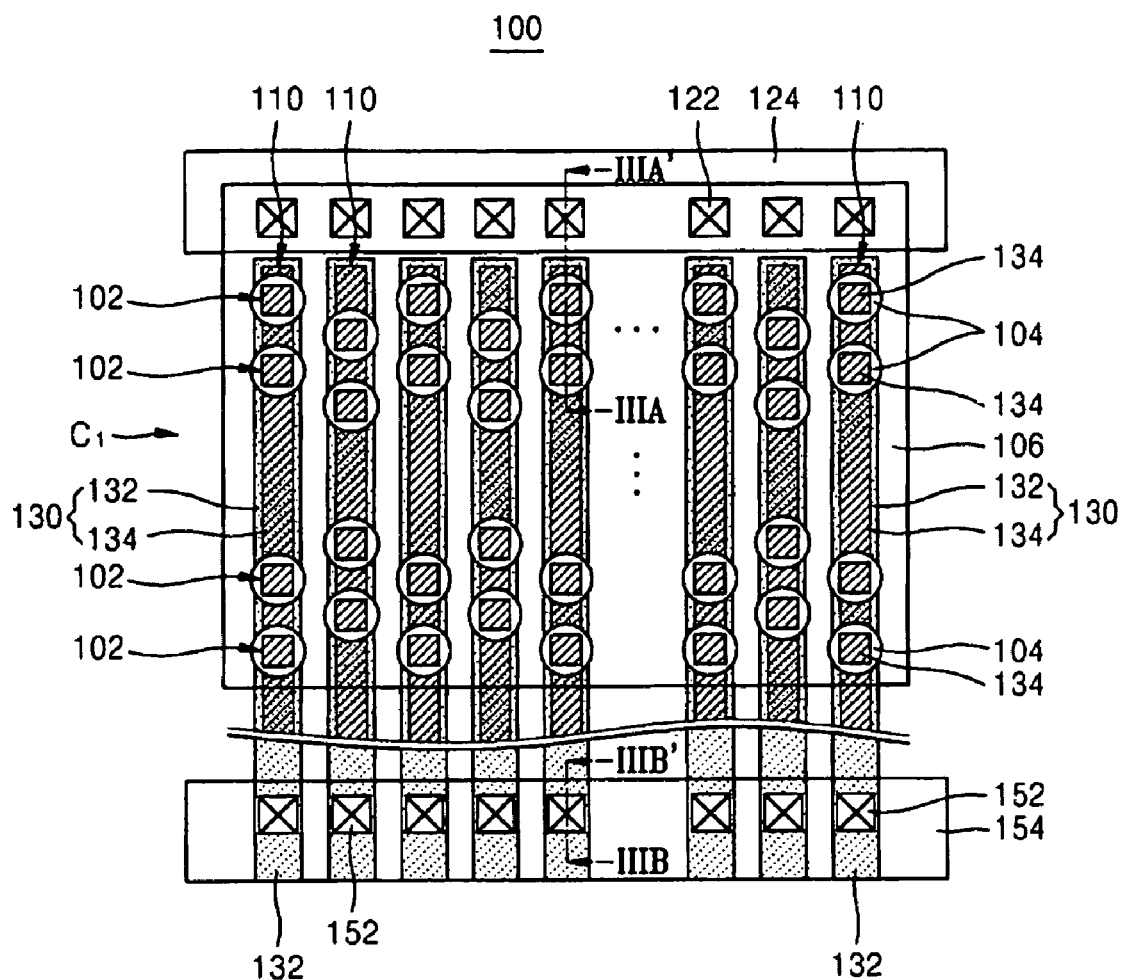
FIG. 1 is a schematic layout of the configuration of a semiconductor memory device according to an embodiment of the inventive concept.

FIG. 1 is a schematic layout of the configuration of a semiconductor memory device 100 according to an embodiment of the inventive concept. FIG. 1 is the layout of an exemplary configuration of a peripheral circuit capacitor C1 formed in a peripheral circuit region B (see FIG. 3) and of a single stage cell type.

Referring to FIG. 1, the peripheral circuit capacitor C1 is formed in the peripheral circuit region B of the semiconductor memory device 100. The peripheral circuit capacitor C1 includes a plurality of capacitor arrays 110 that each comprises a plurality of capacitors 102 formed on a semiconductor substrate.

In FIG. 1, a single peripheral circuit capacitor C1 is depicted. However, the present invention is not limited thereto; thus, a plurality of peripheral circuit capacitors C1 having identical structures may be formed in the peripheral circuit region B.

Each of the capacitors 102 includes a lower electrode 104 and an upper electrode 106. The upper electrode 106 is formed to connect at least a portion of the capacitor arrays 110 in parallel, respectively.

A first node 130 that connects at least a portion of the capacitors 102 in parallel, respectively, is formed on a lower part of the lower electrode 104.

The upper electrode 106 is electrically connected to a second node 124 through a contact 122. The second node 124 may be configured as an upper wiring layer in which the second node 124 is electrically connected to the upper electrodes 106 of the capacitors 102.

The first node 130 of the peripheral circuit capacitor C1 may include a first conductive layer 132 and a second conductive layer 134. The first conductive layer 132 may be formed at substantially the same level as a bit line of a unit memory cell formed in a cell array region. Additionally, the first conductive layer 132 may be formed of the same material used to form the bit line. The second conductive layer 134 may be formed at substantially the same level as a buried contact that is connected between source/drain regions of a transistor and a cell capacitor of the unit memory cell in the cell array region. The first conductive layer 132 and the second conductive layer 134 may also be electrically connected to each other.

The lower electrode 104 may be formed to directly contact to the first node 130, in the peripheral circuit capacitor C1.

In FIG. 1, first conductive layers 132 and second conductive layers 134, which constitute the first node 130, may be configured to respectively extend in a bar shapes to connect the capacitors 102 arranged in a line in parallel for each of the capacitor arrays 110.

However, in other embodiments, the first and second conductive layers 132 and 134 may be configured in various manners and are not limited to the configuration shown in the example embodiment illustrated in FIG. 1. That is, the first node 130 is not limited to the configuration illustrated in FIG. 1, as it can be configured in various ways within the scope of the inventive concept, as will be described later with practical examples.

The peripheral circuit capacitor C1 may further include a connection between the first conductive layers 132 of the first node 130, which connects the capacitors 102 in parallel, to a wire layer 154 through a contact 152.

Figure 2:
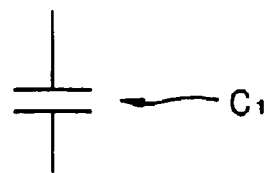
FIG. 2 is an equivalent circuit of a single stage cell type peripheral circuit capacitor of FIG. 1, according to an embodiment of the inventive concept.

FIG. 2 is an equivalent circuit of the single stage cell type peripheral circuit capacitor C1 of FIG. 1, according to an embodiment of the inventive concept.

Figure 3:
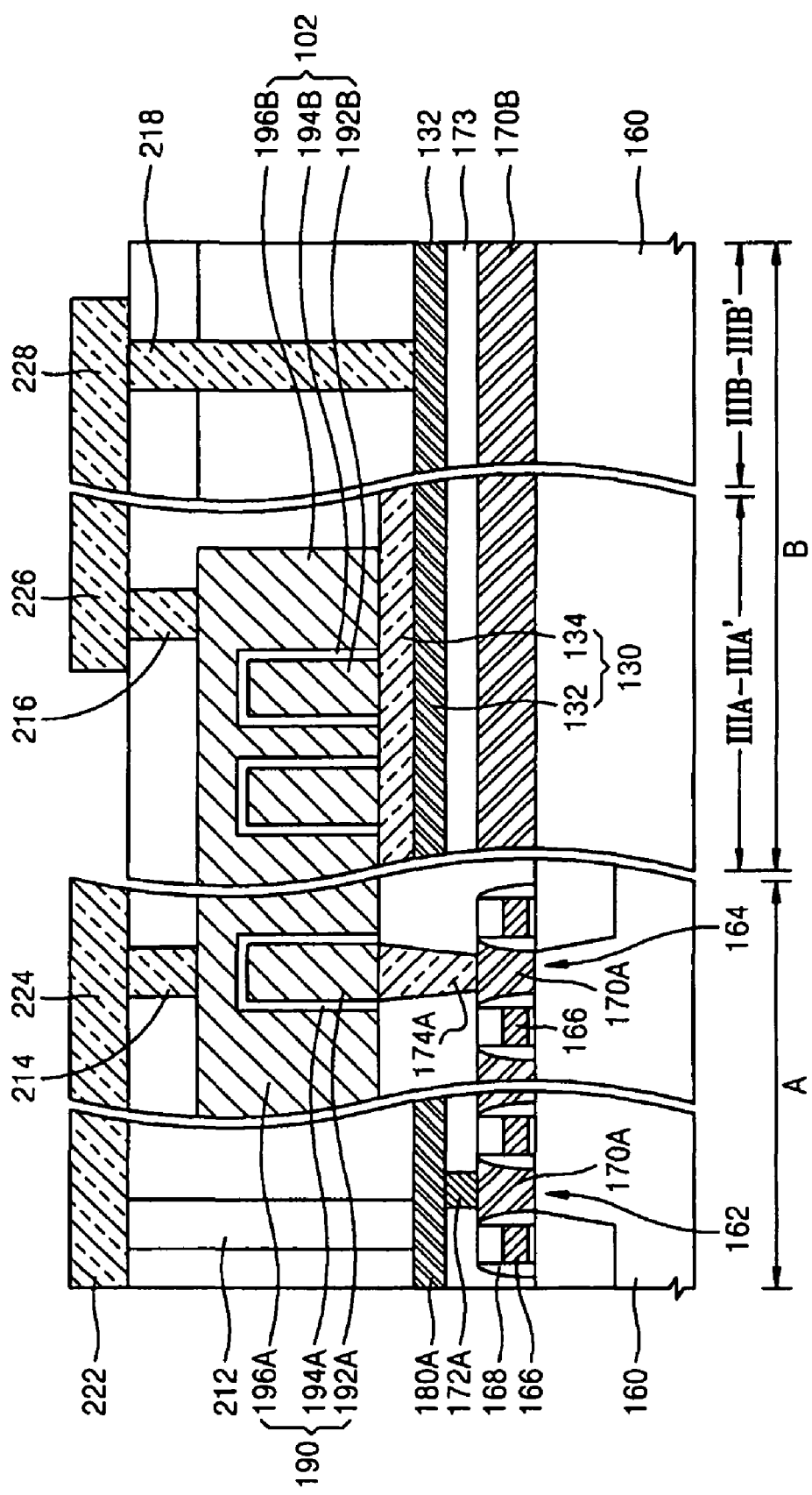
FIG. 3 is a schematic cross-sectional view of the configuration of the semiconductor memory device of FIG. 1, taken along line IIIA-IIIA' and along line IIIB-IIIB' of FIG. 1, according to an embodiment of the inventive concept.

FIG. 3 is a schematic cross-sectional view of the configuration of the semiconductor memory device 100 of FIG. 1, taken along line IIIA-IIIA' and along line IIIB-IIIB' of FIG. 1, according to an embodiment of the inventive concept. In FIG. 3, the configuration of the cross-sectional view taken line IIIA-IIIA' and the cross-sectional view taken along line IIIB-IIIB' of FIG. 1, which are included in the peripheral circuit region B, are shown together with the configuration of the cross-sectional view in a cell array region A which is formed at a substantially similar level to the peripheral circuit region B.

Referring to FIG. 3, the semiconductor memory device 100 according to the present embodiment of the inventive concept includes the cell array region A and the peripheral circuit region B that is separated from the cell array region A. The cell array region A may include a plurality of gate electrodes 166 that respectively constitute transistors on a substrate 160, as well as a first source/drain 162 and a second source/drain 164 respectively formed on both sides of each of the gate electrodes 166 on the substrate 160. Self-aligning contacts 170A are respectively formed on the first source/drain 162 and the second source/drain 164 on both sides of each of the gate electrodes 166 in the cell array region A. The self-aligning contact 170A is self-aligned by forming insulating spacers 168 which are formed between sidewalls of the gate electrode 166 and the self-aligning contact 170A.

A bit line 180A is connected to the first source/drain 162 through the self-aligning contact 170A and a direct contact 172A. A cell capacitor 190 is connected to the second source/drain 164 through the self-aligning contact 170A and a buried contact 174A. The cell capacitor 190 includes a lower electrode 192A, a dielectric film 194A, and an upper electrode 196A. The cell capacitor 190 may be formed at substantially the same level as the capacitors 102 that constitute the peripheral circuit capacitor C1 (see FIG. 1) on the substrate 160.

In the cell array region A, the bit line 180A is connected to a first upper wire layer 222 through a first contact 212. Also, the upper electrode 196A of the cell capacitor 190 is connected to a second upper wire layer 224 through a second contact 214. The first and second upper wire layers 222 and 224 may be formed at substantially the same level as each other and may be formed of the same material.

In the peripheral circuit region B, a lower conductive layer 170B is formed on the substrate 160 such that the lower conductive layer 170B is at substantially the same level as the self-aligning contacts 170A formed in the cell array region A. The self-aligning contacts 170A and the lower conductive layer 170B may be formed at the same time using the same material.

In the cell array region A, the capacitors 102 that constitute the peripheral circuit capacitor C1 may be formed at substantially the same level as the cell capacitor 190. Each of the capacitors 102 may include a lower electrode 192B, a dielectric film 194B, and an upper electrode 196B. The lower electrode 192B, the dielectric film 194B, and the upper electrode 196B formed in the peripheral circuit region B and the lower electrode 192A, the dielectric film 194A, and the upper electrode 196A formed in the cell array region A may be respectively formed as substantially the same level and may be respectively formed of the same materials. The lower electrode 192B, the dielectric film 194B, and the upper electrode 196B that constitute each of the capacitors 102 of the peripheral circuit capacitor C1 may also be respectively formed at the same time as the lower electrode 192A, the dielectric film 194A, and the upper electrode 196A formed in the cell array region A.

In the peripheral circuit region B, the first conductive layer 132 and the second conductive layer 134 may be sequentially stacked in the stated order on the lower conductive layer 170B with a first interlayer insulating layer 173 interposed therebetween. The first conductive layer 132 and the second conductive layer 134 constitute the first node 130 of the peripheral circuit capacitor C1. The first conductive layer 132 may be formed at substantially the same level as the bit line 180A formed in the cell array region A and may be formed of the same material used to form the bit line 180A. The second conductive layer 134 may be formed at substantially the same level as the buried contact 174A formed in the cell array region A, and may be formed of the same material used to form the buried contact 174A. The first conductive layer 132 may be formed of a material having a resistivity lower than a material used to form the second conductive layer 134. For example, the first conductive layer 132 may be formed of W or WSix, and the second conductive layer 134 may be formed of polysilicon.

In the peripheral circuit region B, the upper electrode 196B may be connected to a third upper wire layer 226 through a third contact 216. Also, the first conductive layer 132 of the first node 130 may be connected to a fourth upper wire layer 228 through a fourth contact 218.

The lower electrode 192B and the upper electrode 196B depicted in FIG. 3 may be respectively configured as the lower electrode 104 and the upper electrode 106 depicted in FIG. 1.

The third contact 216 and the third upper wire layer 226 depicted in FIG. 3 may also be respectively configured as the contact 122 and the second node 124 depicted in FIG. 1. Additionally, the fourth contact 218 and the fourth upper wire layer 228 depicted in FIG. 3 may be respectively configured as the contact 152 and the wire layer 154 depicted in FIG. 1.

The third contact 216 and the fourth contact 218 may respectively be formed at the same time as the first contact 212 and the second contact 214 formed in the cell array region A, and may be formed of the same material used to form the first contact 212 and the second contact 214.

The first upper wire layer 222, the second upper wire layer 224, the third upper wire layer 226, and the fourth upper wire layer 228 may be formed at substantially the same level on the substrate 160, and may be formed of the same material.

Figure 4:
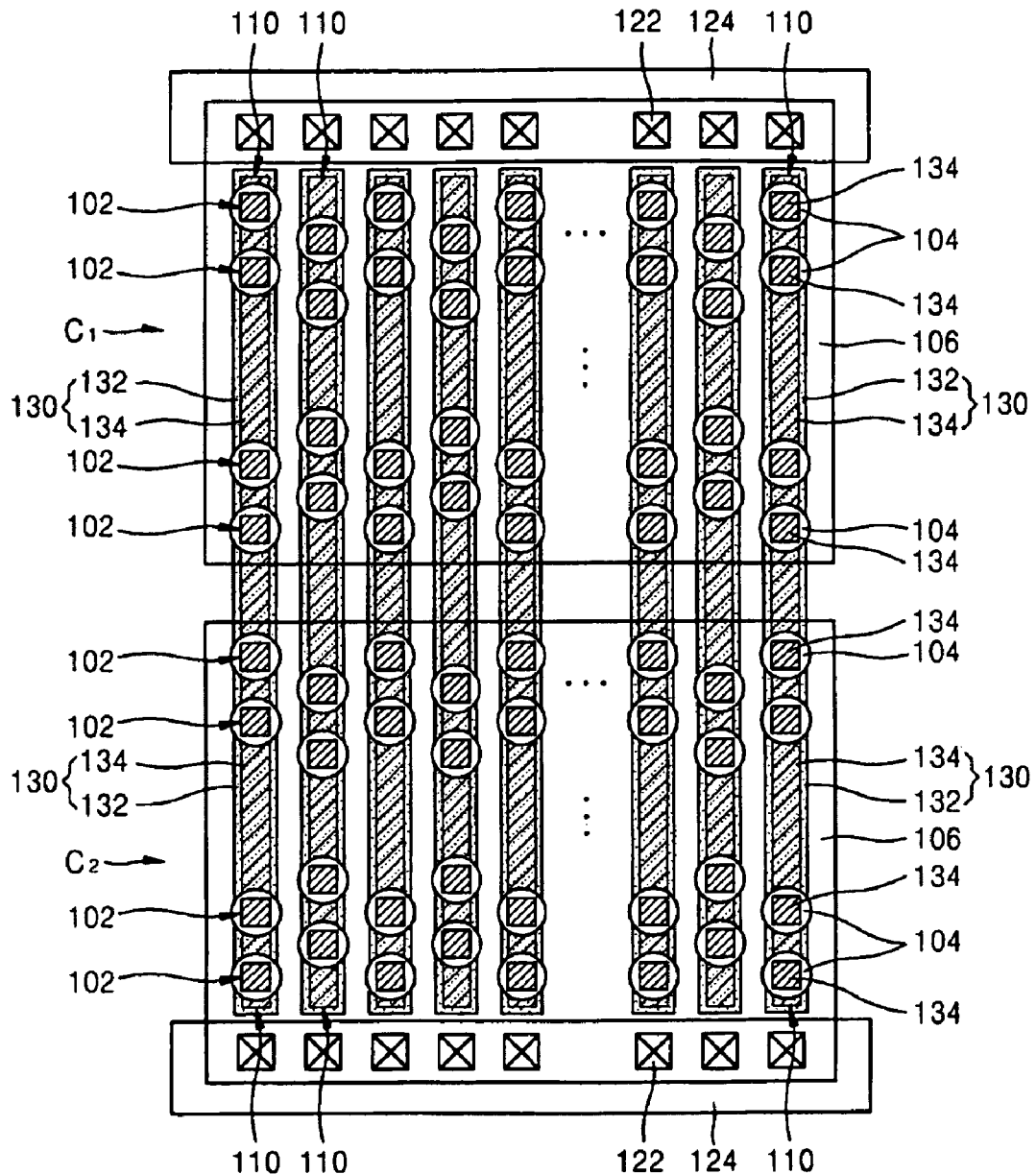
FIG. 4 is a schematic layout of the configuration of a semiconductor memory device according to another embodiment of the inventive concept.

FIG. 4 is a schematic layout of the configuration of a semiconductor memory device 400 according to another embodiment of the inventive concept. In FIG. 4, like reference numerals are used to indicate elements that are identical to the elements of FIG. 1, and thus, the description thereof will not be repeated.

FIG. 4 shows a layout of a two-stage cell type peripheral circuit capacitor in which two peripheral circuit capacitors C1 and C2 are connected in series in a peripheral circuit region of the semiconductor memory device 400 according to the present embodiment of the inventive concept.

In FIG. 4, the semiconductor memory device 400 has the substantially the same configuration as the semiconductor memory device 100 described with reference to FIGS. 1 and 3 except that the two peripheral circuit capacitors C1 and C2 are connected to each other in series by the first nodes 130 that include the first conductive layer 132 and the second conductive layer 134. The peripheral circuit capacitor C2 may have substantially the same configuration as the peripheral circuit capacitor C1 described with reference to FIGS. 1 and 3.

Figure 5:
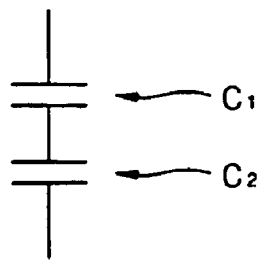
FIG. 5 is an equivalent circuit of a peripheral circuit capacitor of FIG. 4, according to another embodiment of the inventive concept.

FIG. 5 is an equivalent circuit of the two peripheral circuit capacitors C1 and C2 of FIG. 4, according to another embodiment of the present invention.

Figure 6:
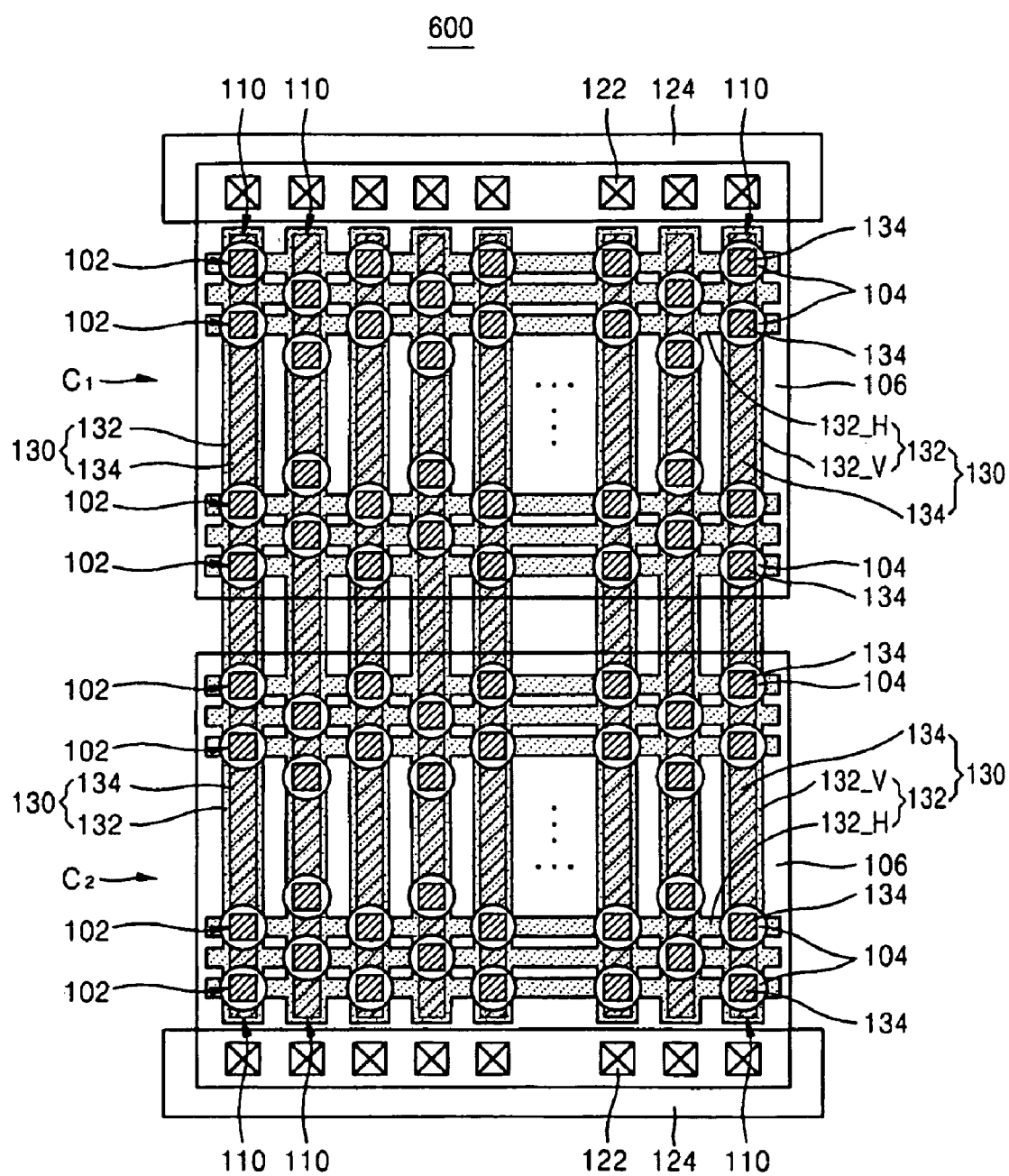
FIG. 6 is a schematic layout of the configuration of a semiconductor memory device according to another embodiment of the inventive concept.

FIG. 6 is a schematic layout of the configuration of a semiconductor memory device 600 according to another embodiment of the inventive concept. In FIG. 6, like reference numerals are used to indicate elements that are identical to the elements of FIGS. 1 and 4, and thus, the description thereof will not be repeated.

FIG. 6, similarly to FIG. 4, shows a layout of a two stage cell type peripheral circuit capacitor in which two peripheral circuit capacitors C1 and C2 are connected in series in a peripheral circuit region of the semiconductor memory device 600 according to the present embodiment of the inventive concept.

In the semiconductor memory device 600 of FIG. 6, like in FIG. 4, the two peripheral circuit capacitors C1 and C2 are connected to each other in series by the first nodes 130 that include the first conductive layer 132 and the second conductive layer 134. However, the semiconductor memory device 600 is different from the semiconductor memory device 400 in that the first conductive layer 132 that constitutes the first node 130 has a mesh type structure including a plurality of vertical first conductive layers 132_V and a plurality of horizontal first conductive layers 132_H. The vertical first conductive layers 132_V extend parallel to each other along the direction that the second conductive layer 134 extends so that the capacitors 102 arranged in rows along the extending direction of the second conductive layer 134 can be connected in parallel. The horizontal first conductive layers 132_H extend parallel to each other along a direction perpendicular to the extending direction of the second conductive layer 134 so that the capacitors 102 arranged in rows along the perpendicular direction to the extending direction of the second conductive layer 134 can be connected in parallel. The vertical first conductive layers 132_V and the horizontal first conductive layers 132_H are formed in one unit, and thus, the first conductive layer 132 has a mesh pattern shape when the first conductive layer 132 is seen from above.

Figure 7:
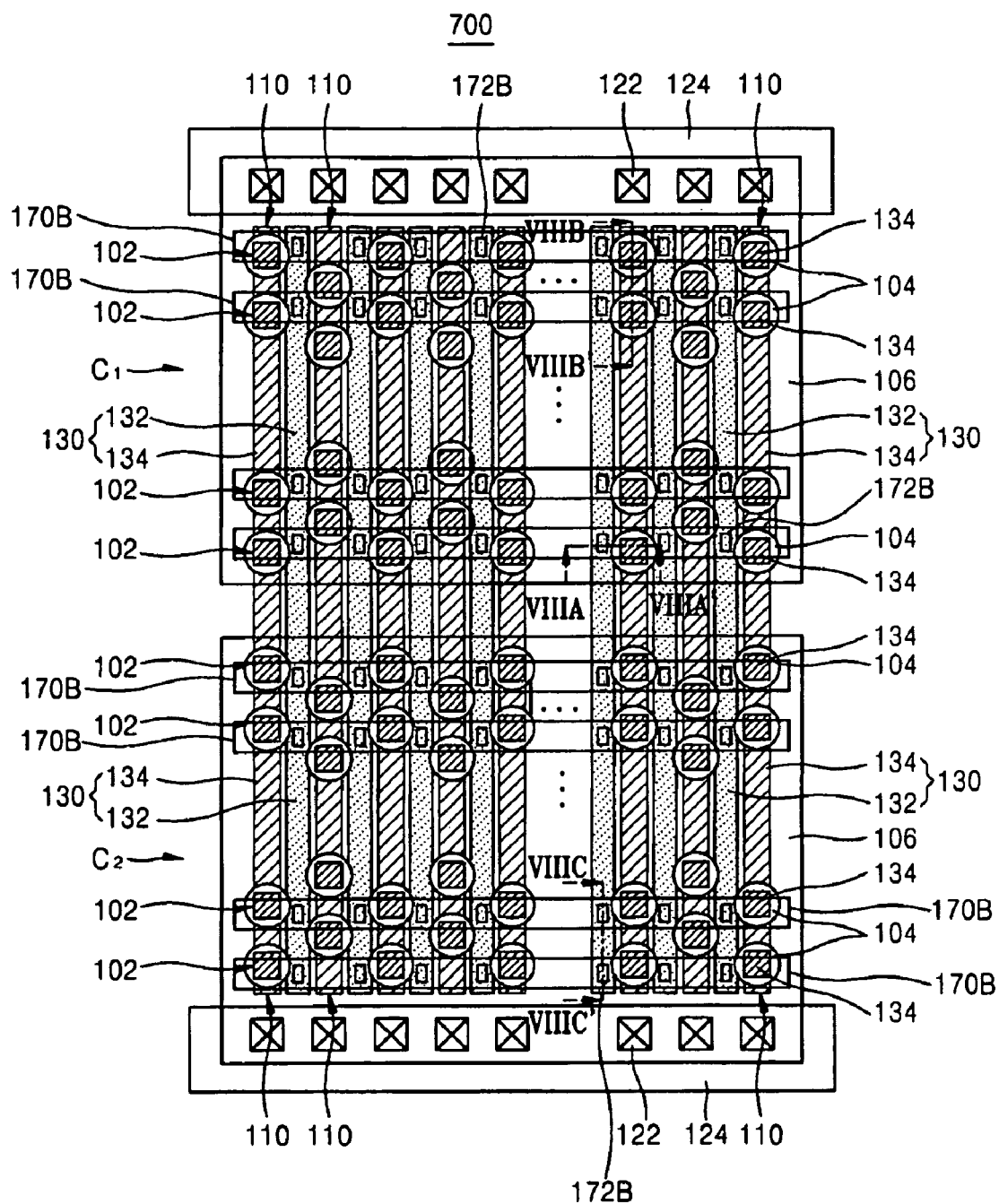
FIG. 7 is a schematic layout of the configuration of a semiconductor memory device according to another embodiment of the inventive concept.

FIG. 7 is a schematic layout of the configuration of a semiconductor memory device 700 according to another embodiment of the inventive concept.

Figure 8:
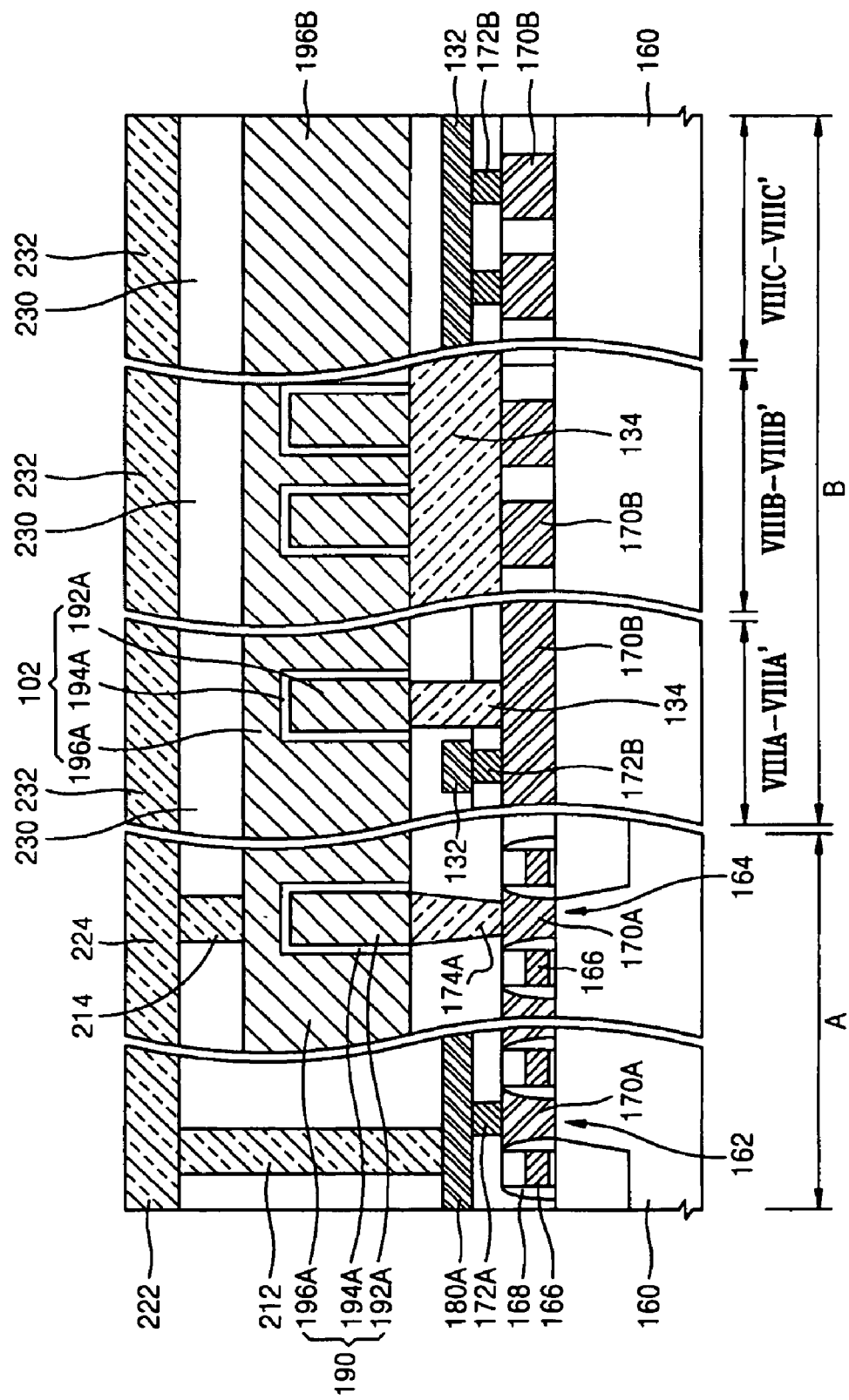
FIG. 8 is a schematic cross-sectional view of the configuration of the semiconductor memory device of FIG. 7, taken along line VIIIA-VIIIA', along line VIIIB-VIIIB', and along line VIIIC-VIIIC' of FIG. 7, according to another embodiment of the inventive concept.

FIG. 8 is a schematic cross-sectional view of the structure of the semiconductor memory device 700 of FIG. 7, taken along line VIIIA-VIIIA', along line VIIIB-VIIIB', and along line VIIIC-VIIIC' of FIG. 7, according to another embodiment of the inventive concept. In FIG. 8, the configuration of the cross-sectional view taken along line VIIIA-VIIIA' is included in a peripheral circuit region B and is shown together with the configuration of the cross-sectional view in a cell array region A which is formed at substantially the same level as the peripheral circuit region B.

In FIGS. 7 and 8, like reference numerals are used to indicate elements that are identical to the elements of FIGS. 1, 3, 4, and 6, and thus, the description thereof will not be repeated.

Like in the semiconductor memory devices 400 and 600 of FIGS. 4 and 6, FIG. 7 shows a layout of a two-stage cell type peripheral circuit capacitor in which two peripheral circuit capacitors C1 and C2 are connected in series in a peripheral circuit region of the semiconductor memory device 700. The peripheral circuit capacitors C1 and C2 of FIG. 7 may be expressed as the equivalent circuit of FIG. 5.

In the semiconductor memory device 700 according to the current embodiment, like in the semiconductor memory devices 400 and 600 of FIGS. 4 and 6 according to the previous embodiments, the two peripheral circuit capacitors C1 and C2 are connected to each other in series by the first node 130 that includes the first conductive layer 132 and the second conductive layer 134. The current embodiment differs from the previous embodiments in that the first conductive layer 132 and the second conductive layer 134 are spaced apart from each other and parallel to each other in the peripheral circuit region B, and the second conductive layer 134 that is connected to the capacitor 102 is not directly connected to the first conductive layer 132. Rather, the second conductive layer 134 is electrically connected to the first conductive layer 132 through the lower conductive layer 170B. The lower conductive layer 170B is substantially simultaneously formed with the self-aligning contact 170A such that the lower conductive layer 170B is at substantially the same level as the self-aligning contact 170A formed in the cell array region A, and may be formed of the same material used to form the self-aligning contact 170A. In FIG. 8, the first conductive layer 132 is electrically connected to the lower conductive layer 170B through a fourth conductive layer 172B. The fourth conductive layer 172B is formed at substantially the same level as the direct contact 172A formed in the cell array region A, and is formed of the same material used to form the direct contact 172A. That is, in FIG. 8, the second conductive layer 134 is electrically connected to the first conductive layer 132 through the lower conductive layer 170B and the fourth conductive layer 172B.

A second interlayer insulating film 230 may be formed on the two peripheral circuit capacitors C1 and C2, and an upper wire layer 232 may be formed on the second interlayer insulating film 230 in the peripheral circuit region B. However, the upper wire layer 232 may be omitted.

The semiconductor memory device 700 of FIGS. 7 and 8 according to the current embodiment has a configuration in which the first and second conductive layers 132 and 134 of the first node 130 are electrically connected to one another via the lower conductive layer 170B and the fourth conductive layer 172B. The resistivity of the first node 130 can be reduced by forming the first node 130 using a low resistivity material, such as W or WSix.

The semiconductor memory devices 100, 400, 600, and 700 described with reference to FIGS. 1 through 8 according to embodiments of the inventive concept can be respectively configured as power-decoupling capacitors for filtering noise present between operating power sources, and also, can be respectively configured as pumping capacitors of internal power boosting circuits.

Figure 9:
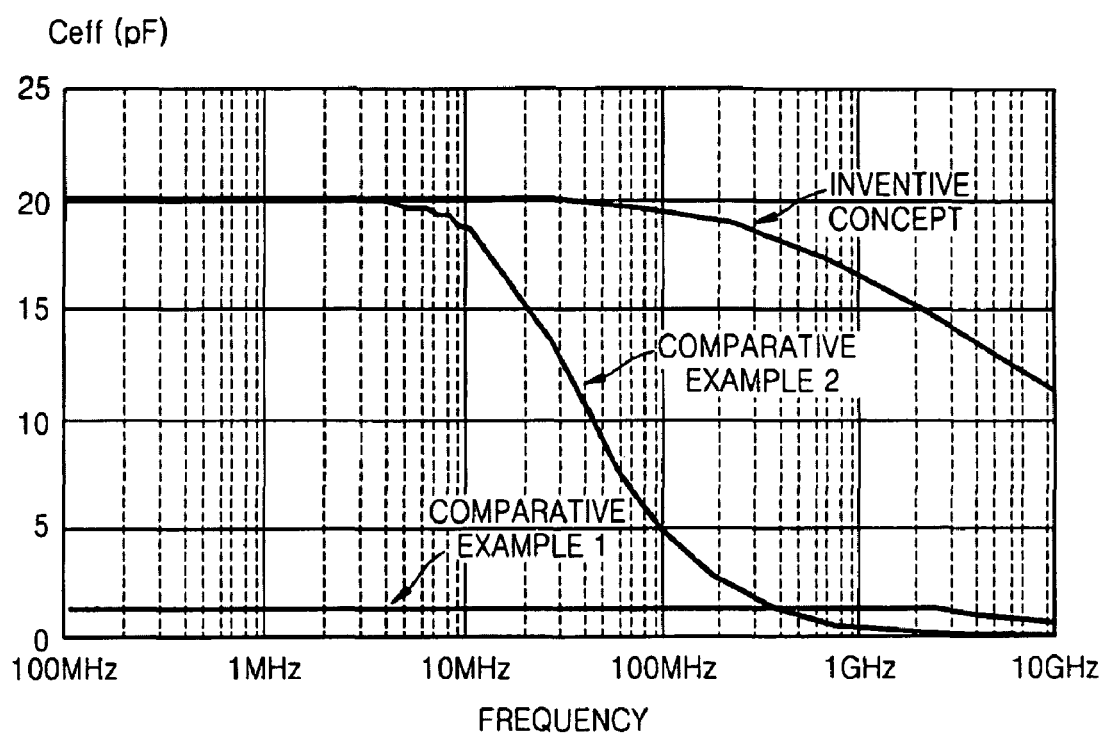
FIG. 9 is a graph showing an evaluation result of the characteristics of an effective capacitance of a power decoupling capacitor realized from a peripheral circuit capacitor of a semiconductor memory device according to an embodiment of the inventive concept.

FIG. 9 is a graph showing an evaluation result of the characteristics of an effective capacitance of a power decoupling capacitor realized from a peripheral circuit capacitor of a semiconductor memory device according to an embodiment of the inventive concept.

In FIG. 9, the effective capacitance characteristic according to frequency of a conventional metal oxide semiconductor (MOS) type capacitor as a first comparative example and the effective capacitance characteristic according to frequency of a conventional cell type decoupling capacitor as a second comparative example are included. In order to obtain the evaluation results of FIG. 9, a two stage-cell type decoupling capacitor in which two peripheral circuit capacitors are connected in series is used in the capacitors of the current inventive concept and the second comparative example.

When the second comparative example is compared to the first comparative example in which a MOS type capacitor is used, the second comparative example realized a capacitance of approximately 11 times greater than that of the first comparative example in the same area. However, when operating at a high frequency of greater than 10 MHz, the effective capacitance of the second comparative example is significantly reduced. The decoupling capacitor according to the current inventive concept, on the other hand, shows only approximately a 15% capacitance reduction even at a high frequency of 1 GHz. From this result, when the decoupling capacitor according to the current inventive concept is compared to the first and second comparative examples, the high frequency characteristic of the effective capacitance of the decoupling capacitor is improved by approximately 100 times greater than that of the first and second comparative examples.

In a peripheral circuit capacitor of a semiconductor memory device according to the inventive concept, a first node for connecting a plurality of capacitors in parallel includes a first conductive layer that is formed at substantially the same level as a bit line in a cell array region and is formed of a material used to form the bit line. Also, the semiconductor memory device uses the first node that includes the first conductive layer to connect a plurality of peripheral circuit capacitors in series, wherein each of the peripheral circuit capacitors is formed of a plurality of capacitors connected in parallel. The efficiency reduction of a capacitor at a high frequency can be improved by forming the first conductive layer using a low resistivity material. In particular, as the development of techniques for manufacturing highly integrated semiconductor memory devices improves, a material for forming a bit line formed in a cell array region of a semiconductor memory device can be replaced by a low resistivity material such as W or WSix. Thus, the first conductive layer of the first node of the peripheral circuit capacitors may be formed in the peripheral circuit region at substantially the same level as the bit line formed in the cell array region using the same material. Thus, the resistivity of the first node of the peripheral circuit capacitors can be reduced. Also, an intermediate node of a two-stage cell type decoupling capacitor in which two peripheral circuit capacitors are connected in series is formed using the first node. Thus, the intermediate node can be formed to also have a low resistivity characteristic. Accordingly, the effective capacitance of the peripheral circuit capacitors can be increased.

A two-stage cell type power decoupling capacitor with a pumping capacity of an internal power boosting circuit may be formed using peripheral circuit capacitors of a semiconductor memory device, and thus, the effective capacitance characteristics of the peripheral capacitors can also be increased.

Additionally, in the semiconductor memory device according to the inventive concept, the first conductive layer formed at substantially the same level as the bit line in the peripheral circuit region can be electrically connected to an upper wire layer using the operation of forming wire contacts, such as a direct contact, the bit line, and a metal contact, which are required for configuring the cell array region. Thus, a single stage cell type power decoupling capacitor can be realized.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
   a plurality of unit cells formed in a cell array region, the plurality of unit cells each comprising:
      a transistor,
      a bit line that is electrically connected to a first source/drain region of the transistor,
      a buried contact that is electrically connected to a second source/drain region of the transistor, and
      a cell capacitor that is electrically connected to the second source/drain region through the buried contact, the cell capacitor including a top surface and a bottom surface;
   a first peripheral circuit capacitor formed in a peripheral circuit region spaced apart from the cell array region, wherein the first peripheral circuit capacitor comprises a plurality of first capacitors connected to each other in parallel and formed at substantially the same level as the cell capacitor of the cell array region, each of the first capacitors including an upper electrode including a top surface and a lower electrode including a bottom surface, wherein the top surface of the cell capacitor is formed at substantially the same level as the top surfaces of the upper electrodes, and the bottom surface of the cell capacitor is formed at substantially the same level as the bottom surfaces of each of the lower electrodes;
a first node of the first peripheral circuit capacitor electrically connected to at least a first portion of the lower electrodes of the first capacitors in the peripheral circuit region to connect the first portion of the first capacitors in parallel; and
a second node of the first peripheral circuit capacitor electrically connected to at least a second portion of the upper electrodes of the first capacitors in the peripheral circuit region to connect the second portion of the first capacitors in parallel,
wherein the first node of the first peripheral circuit capacitor comprises a first conductive layer that is formed in the peripheral circuit region at substantially the same level as the bit line of the cell array region.

2. The semiconductor memory device of claim 1, wherein the first node further comprises a second conductive layer that is formed in the peripheral circuit region such that the second conductive layer is at substantially the same level as the buried contact of the cell array region, is formed of the same material used to form the buried contact, and is electrically connected to the first conductive layer.

3. The semiconductor memory device of claim 2, wherein the first node of the first peripheral circuit capacitor has a structure in which the second conductive layer is stacked on the first conductive layer so that the first conductive layer directly contacts the second conductive layer.

4. The semiconductor memory device of claim 2, wherein
the cell array region further comprises a plurality of self-aligning contacts that directly contact the first source/drain region and the second source/drain region of the transistor, respectively, where the bit line is electrically connected to the first source/drain region through the self-aligning contacts in the cell array region,
the peripheral circuit region further comprises a third conductive layer that is formed under the first and second conductive layers such that the third conductive layer is at substantially the same level as the self-aligning contacts formed in the cell array region and is formed of the same material used to form the self-aligning contacts, and
the second conductive layer is electrically connected to the first conductive layer through the third conductive layer in the peripheral circuit region.

5. The semiconductor memory device of claim 4, wherein
the bit line is electrically connected to the first source/drain region through each of the self-aligning contacts and a direct contact formed on the self-aligning contacts in the cell array region, and
the peripheral circuit region further comprises a fourth conductive layer that is formed on the same level as the direct contact under the first conductive layer and is formed of the same material used to form the direct contact, and
the second conductive layer is electrically connected to the first conductive layer through the third and fourth conductive layers in the peripheral circuit region.

6. The semiconductor memory device of claim 4, wherein the first and second conductive layers are spaced apart from each other.

7. The semiconductor memory device of claim 2, wherein the first conductive layer has a resistivity lower than that of the second conductive layer.

8. The semiconductor memory device of claim 1, wherein the first peripheral circuit capacitor forms a power decoupling capacitor for filtering noise present between operational power sources.

9. The semiconductor memory device of claim 1, wherein the first peripheral circuit capacitor forms a pumping capacitor of an internal power boosting circuit.

10. The semiconductor memory device of claim 1, wherein the upper electrodes are part of a single continuous electrode.

11. The semiconductor device of claim 1, wherein the cell electrode includes an upper electrode and a lower electrode.

12. The semiconductor device of claim 11, wherein:
an upper-most surface of the upper electrode of the cell capacitor is formed at substantially the same level as the top surfaces of each of the upper electrodes of the first capacitors, and the bottom surface of the lower electrode of the cell capacitor is formed at substantially the same level as the bottom surfaces of each of the bottom electrodes of the first capacitors.

13. The semiconductor device of claim 11, wherein:
the upper electrode of the cell capacitor and the upper electrodes of the first capacitors comprise electrodes formed at the same time, and
the lower electrode of the cell capacitor and the lower electrodes of the first capacitors comprise electrodes formed at the same time.

14. A semiconductor memory device comprising:
a plurality unit cells formed in a cell array region, the plurality of unit cells each comprising:
a transistor,
a bit line that is electrically connected to a first source/drain region of the transistor,
a buried contact that is electrically connected to a second source/drain region of the transistor, and
a cell capacitor that is electrically connected second source/drain region through the buried contact;
a first peripheral circuit capacitor formed peripheral circuit region spaced apart from the cell array region, wherein the first peripheral circuit capacitor comprises a plurality of first capacitors connected to each other in parallel and formed at substantially the same level as the cell capacitor of the cell array region, each of the first capacitors including an upper electrode and a lower electrode;
a first node of the first peripheral circuit capacitor electrically connected to at least a first portion of the lower electrodes of the first capacitors in the peripheral circuit region to connect the first portion of the first capacitors in parallel;
a second node of the first peripheral circuit capacitor electrically comic to at least a second portion of the upper electrodes of the first capacitors in the peripheral circuit region to connect the second portion of the first capacitors in parallel; and
a second peripheral circuit capacitor formed in the peripheral circuit region and adjacent to the first peripheral circuit capacitor, the second peripheral circuit capacitor comprising a plurality of second capacitors formed at substantially the same level as the cell capacitor of the cell array region, the plurality of second capacitors connected to each other in parallel, wherein the first node of the first peripheral circuit capacitor comprises a first conductive layer that is formed in the peripheral circuit region at substantially the same level as the bit line of the cell array region, and the first peripheral circuit capacitor and the second peripheral circuit capacitor are connected to each other in series by the first node.

15. A semiconductor memory device comprising:
a plurality of unit cells formed in a cell array region, the plurality of unit cells each comprising:
a transistor,
a bit line that is electrically connected to a first source/drain region of the transistor,
a buried contact that is electrically connected to a second source/drain region of the transistor, and
a cell capacitor that is electrically connected to the second source/drain region through the buried contact;
a first peripheral circuit capacitor formed in a peripheral circuit region spaced apart from the cell array region, wherein the first peripheral circuit capacitor comprises a plurality of first capacitors connected to each other in parallel and formed at substantially the same level as the cell capacitor of the cell array region, each of the first capacitors including an upper electrode including a top surface and a lower electrode including a bottom surface, wherein the upper electrodes are part of a single continuous electrode;
a first node of the first peripheral circuit capacitor electrically connected to at least a first portion of the lower electrodes of the first capacitors in the peripheral circuit region to connect the first portion of the first capacitors in parallel; and
a second node of the first peripheral circuit capacitor electrically connected to at least a second portion of the upper electrodes of the first capacitors in the peripheral circuit region to connect the second portion of the first capacitors in parallel,
wherein the first node of the first peripheral circuit capacitor comprises a first conductive layer that is formed in the peripheral circuit region at substantially the same level as the bit line of the cell array region.

16. The semiconductor device of claim 15, wherein the cell capacitor includes an upper electrode and a lower electrode.

17. The semiconductor device of claim 16, wherein:
an upper-most surface of the upper electrode of the cell capacitor is formed at substantially the same level as the upper-most surfaces of each of the upper electrodes of the first capacitors, and the bottom surface of the cell capacitor is formed at substantially the same level as the bottom surfaces of each of the bottom electrodes of the first capacitors.

18. The semiconductor device of claim 16, wherein:
the upper electrode of the cell capacitor and the upper electrodes of the first capacitors are electrodes formed at the same time, and
the lower electrode of the cell capacitor and the lower electrodes of the first capacitors are electrodes formed at the same time.

19. The semiconductor memory device of claim 15, wherein the first node further comprises a second conductive layer that is formed in the peripheral circuit region such that the second conductive layer is at substantially the same level as the buried contact of the cell array region, is formed of the same material used to form the buried contact, and is electrically connected to the first conductive layer.

20. The semiconductor memory device of claim 19, wherein the first node of the first peripheral circuit capacitor has a structure in which the second conductive layer is stacked on the first conductive layer so that the first conductive layer directly contacts the second conductive layer.

* * * * *